(12) United States Patent
Fujikura et al.

(10) Patent No.: US 7,504,667 B2
(45) Date of Patent: Mar. 17, 2009

(54) LIGHT EMITTING DIODE HAVING SURFACE CONTAINING FLAT PORTION AND PLURALITY OF BORES

(75) Inventors: Hajime Fujikura, Tsukuba (JP); Satosi Nakayama, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 11/237,796

(22) Filed: Sep. 29, 2005

(65) Prior Publication Data

US 2006/0273336 A1  Dec. 7, 2006

(30) Foreign Application Priority Data

Jun. 6, 2005  (JP) ............... 2005-164946

(51) Int. Cl.
*H01L 33/00*  (2006.01)
(52) U.S. Cl. .............. 257/98; 257/95; 257/E33.074
(58) Field of Classification Search ............ 257/98, 257/94, 95, E33.006, E33.008, E33.074; 362/800
See application file for complete search history.

(56) References Cited

U.S. PATENT DOCUMENTS

| | | | |
|---|---|---|---|
| 6,091,085 | A | 7/2000 | Lester |
| 6,441,403 | B1 * | 8/2002 | Chang et al. .............. 257/94 |
| 6,958,493 | B2 * | 10/2005 | Hasegawa et al. .......... 257/79 |
| 2003/0057434 | A1 * | 3/2003 | Hata et al. ............... 257/103 |
| 2003/0141507 | A1 * | 7/2003 | Krames et al. ............ 257/79 |

(Continued)

FOREIGN PATENT DOCUMENTS

CN  1 453 885 A  11/2003

(Continued)

OTHER PUBLICATIONS

I. Schnitzer et al., "30% External Quantum Efficiency from Surface Textured, Thin-Film Light-Emitting Diodes", Appl. Phys. Lett. 63 (Oct. 18, 1993), pp. 2174-2176.

(Continued)

*Primary Examiner*—Anh Phung
*Assistant Examiner*—Allison P Bernstein
(74) *Attorney, Agent, or Firm*—Antonelli, Terry, Stout & Kraus, LLP.

(57) ABSTRACT

A technique of ensuring compatibility between the method of improving the light extraction efficiency by roughening the surface of a LED structure, and the method of avoiding the adverse effect of a low-cost electrode pad ((1) forming a current distribution layer by a transparent conductive film made of metal or metal oxide, and (2) forming a flip chip structure). A light emitting diode has at least an n-type semiconducting layer, an active layer composed of 30 or less quantum well layers, and a p-type semiconducting layer provided on a substrate, wherein the surface of the semiconductor lamination structure contains a flat portion and a plurality of bores. In this case, the in-plane coverage rate ((the area of the bore opening/surface area) ×100) of the plurality of the bores is 10% or more without exceeding 85%; the opening of the bore has a diameter of 100 nm or more without exceeding 4000 nm; the depth of the bore is smaller than the distance between the active layer and the flat portion; and the density of the plurality of the bores expressed in terms of number of bores is $8 \times 10^5$ per/cm$^2$ or more without exceeding $1.08 \times 10^{10}$ per/cm$^2$.

27 Claims, 7 Drawing Sheets

U.S. PATENT DOCUMENTS

| | | | |
|---|---|---|---|
| 2004/0012013 A1* | 1/2004 | Katayama | 257/13 |
| 2004/0113166 A1* | 6/2004 | Tadatomo et al. | 257/98 |
| 2005/0087753 A1* | 4/2005 | D'Evelyn et al. | 257/98 |
| 2005/0211995 A1* | 9/2005 | Ou et al. | 257/80 |
| 2006/0267033 A1 | 11/2006 | Koide et al. | |
| 2007/0018182 A1* | 1/2007 | Beeson et al. | 257/98 |

FOREIGN PATENT DOCUMENTS

| | | |
|---|---|---|
| JP | 8-236867 | 9/1996 |
| JP | 8-274411 | 10/1996 |

OTHER PUBLICATIONS

S.D. Lester et al., "High-Efficiency InGaN MQW Blue and Green LEDs", J. Crystal Growth vol. 189/190 (1998) pp. 786-789.

Isamu Akasaki et al., "Crystal Growth and Properties of Gallium Nitride and Its Blue Light-Emitting Diode", JARECT vol. 19, Semiconductor Technologies (1986), J. Nishizawa (ed), Ohmsha ltd. And North-Holland pp. 295-307.

Kazumasa Hiramatsu et al., "Cathodoluminescence of Movpe-Grown GaN Layer On x-$Ai_2O_3$", J. Crystal Growth 99 (1990) pp. 375-380.

\* cited by examiner

3 μm

LIGHT EMITTING DIODE HAVING SURFACE CONTAINING FLAT PORTION AND PLURALITY OF BORES

BACKGROUND OF THE INVENTION

1 Field of the Invention

The present invention relates to a light emitting diode (LED) and manufacturing method thereof capable of providing excellent effects in internal quantum efficiency and light extraction efficiency over the prior art.

2. Background of the Invention

Efficiency is one of the most important percentage indices in the LED. To be more specific, the LED is required to provide a high light emitting efficiency with the least possible current, namely, to provide high efficiency.

Generally, efficiency depends on the internal quantum efficiency and light extraction efficiency. The internal quantum efficiency can be defined as opto-electrical conversion efficiency in the LED, namely, the efficiency wherein the injected current is converted into photon in the light emitting layer.

The light extraction efficiency refers to the efficiency wherein the light produced in the light emitting layer is extracted from the LED chip. Fifty percent or more internal quantum efficiency is provided by almost all the LEDs available on the market. Some of these LEDs provide approximately 100% internal quantum efficiency.

In the meantime, light extraction efficiency is known to depend on the ratio of refraction indexes inside and outside the LED on the light extraction surface, and the surface properties thereof. To be more specific, the refraction index of the compound semiconductor commonly used as the material of LED (n≈2.2 through 3.8 , e.g. 2.7 for GaN) is much greater than that (n=1) of air (vacuum).

Thus, according to the Snell's law, the light that can be emitted from the light emitting diode to the outside is restricted to the cases where the incident angle of the light from inside the LED to the surface is below a certain critical angle ($\theta c$).

To put it another way, on the active layer of the LED structure, light is emitted in all directions, but much of the light having been generated cannot be extracted to the outside of the LED due to the full reflection on the LED structure surface. Taking an example of GaN, the critical angle ($\theta c$) is $\theta c=21.9$ degrees.

Only 4 percent of the full light produced (all the light having been generated) can be taken out of the LED. The light fully reflected on the surface of the LED structure again enters the LED to be reflected by the interface inside the LED or the back of the LED. This light is again applied to the surface of the LED structure. The interface inside the LED or the back of the LED is commonly composed of the surfaces parallel to the surface of the LED structure.

Accordingly, the incident angle to the surface of the LED structure of the light applied against to the surface of the LED structure is the same as the initial incident angle to the surface of the LED structure, and is again fully reflected. As described above, the light having been fully reflected once cannot be taken out of the LED. It is repeatedly subjected to full reflection and is absorbed during this process, and is lost in the form of heat by recombination through a defect level.

A method of roughening the surface of the LED structure has been proposed in the prior art as a means of improving light extraction efficiency. This is based on the following principle: If the light extraction surface is roughened by etching or other means, the light having been fully reflected by the light extraction surface is reflected by the interface or back of the LED and enters the surface of the LED structure.

The incident angle in this case differs from the incident angle at the time of initial full reflection. Accordingly, light is repeatedly subjected to full reflection inside the LED. In some stage during the course of repeated full reflection, there is a probability of the light entering the surface of the LED structure at an angle below the critical angle, with the result that light extraction efficiency is improved.

The aforementioned advantages obtained from the proposed method of roughening the LED structure have long been known. For example, I. Schnitzer et al., "30% external quantum efficiency from surface textured, thin-film light-emitting diodes", Appl. Phys. Lett. 63 (1993) 2174 (Non-patent Document 1) discloses an example, wherein the surface of the AlGaAs-based LED structure was roughened by gas etching, and the external quantum efficiency (internal quantum efficiency×light extraction efficiency rate) of 9% on the LED not subjected to surface roughening was increased to 30%.

For the GaN-based LED, the U.S. Pat. No. 6,091,085 (Patent Document 1) discloses a method of improve the light extraction efficiency by forming a concavo-convex pattern on the substrate surface. At the same time, it introduces a method of forming a concavo-convex pattern on the surface of the GaN-based LED structure by encouraging growth of a substrate having a part of its surface coated with an insulator.

It further describes the method of forming a concavo-convex pattern on the surface of the GaN-based LED structure by encouraging growth of the extreme surface layer of the GaN-based LED structure at a temperature as low as 1040 degrees Celsius or less or at a V/III ratio of 1000 or less.

The extreme surface layer of the GaN-based LED structure in this case refers to the p type GaN layer when consideration is given to the fact that the GaN-based LED commonly known at that time was the sapphire/low-temperature growth buffer layer/Si-dope n-type GaN/InGaN multiple quantum well layer/Mg dope p-type AlGaN, Mg dope p-type GaN (e.g. S. Nakamura et al., "High Brightness InGaN blue, green and yellow light emitting diodes with quantum well structure", Jpn. J. Appl. Phys. Vol 34 (1995) pp. L797-L799 (Non-patent Document 2) and S. D. Lester et al. "High-efficiency InGaN MQW blue and green LEDs", J. Crystal Growth Vol. 189/190 (1998) pp. 786-789 (Non-patent Document 3).

Similarly to the Patent Document 1, the U.S. Pat. No. 6,441,403 (Patent Document 2) discloses the method of forming a concavo-convex pattern the surface of the GaN-based LED structure by encouraging the growth of the extreme surface layer of the GaN-based LED at a temperature of 400 through 1000 degrees Celsius, whereby the light extraction efficiency is improved.

The GaN-based LED having a concavo-convex pattern on the surface as described above is mentioned in the Japanese Application Patent Laid-Open Publication No. Hei 08-236867 (Patent Document 3) prior to Patent Document 1. Further, the Japanese Application Patent Laid-Open Publication No. Hei 08-274411 (Patent Document 4) also refers to the GaN-based LED having a concavo-convex pattern on the surface.

Further, examples of GaN-based LEDs having the surfaces provided with multiple pits formed at the time of growth are disclosed in I. Akasaki et al., "Crystal growth and properties of gallium nitride and its blue light emitting diode", JARECT Vol. 19, Semiconductor Technologies (1986), J. Nishizawa (ed), Ohmsha Ltd. And North-Holland (Non-patent Document 4), and K. Hiramatsu et al., "Cathodo luminescence of MOVPE grown GaN layer on α-Al$_2$O$_3$", J. Crystal Growth 99 (1990) 375 (Non-patent Document 5).

For the GaN-based LED, growth of a GaN-based material on a flat surface was difficult in the stage of the Patent Document 1 or in the initial stage of the study of the GaN-based LED prior to the Patent Document 1. This shows that the LED having a concavo-convex pattern on the surface was commonly known in those days.

It should be pointed out that, in order to ensure a sufficient increase in light extraction efficiency in the LED having such a roughened surface, absorption of light must be reduced sufficiently inside the LED. Assume that the active layer is thick, and most of the light having returned inside the LED through full reflection from the surface is again absorbed by the active layer.

In this case, the light having been absorbed by the active layer generates an electron hole pair. The light produced by recombination of the electron hole pair is again radiated in all directions (called "photon recycling"). Under this condition, information on the traveling direction of light is lost due to absorption. Thus, the light extraction efficiency cannot be improved despite the efforts of roughening the surface and converting the light reflection angle.

Incidentally, the configuration and arrangement of the electrode are the factors as important as surface properties in considering the light extraction efficiency. To put it another way, wiring must be provided from the external power supply to the electrode on at least a part of the electrode installed on the surface of the LED. This requires an area (electrode pad) having some mechanical strength to be formed. Such an electrode pad does not allow the passage of light, and prevents light from being extracted out of the device.

A representative way of alleviating the adverse effect of the aforementioned electrode pad is to provide so-called "current distribution layer", wherein a sufficient large distance (10 μm or more) is provided between the surface and light emitting layer in such a way that the carrier will expand sufficiently before the carrier supplied from the electrode pad reaches the light emitting layer, and that there will be a decrease in the percentage of the portion hidden behind the electrode out of the energized area on the surface where the active layer is present. This is a simple method of allowing crystal growth of the current distribution layer simultaneously with the light emitting layer.

Since the thickness of the current distribution layer is much greater than that of the active layer (typically 1 μm or less), there will be an increase in the thickness of the grown film, accompanied by greater production costs. In addition to this disadvantage, since such a current distribution layer is normally doped to a high density, light is absorbed by the defect level caused by impurity level and high-density doping. If the thickness is as much as 10 μm, there will a substantial reduction in efficiency due to light absorption.

To get rid of the aforementioned disadvantages, it is effective to install a very thin metallic film or a transparent conducting film, instead of a thick semiconducting layer, on the surface of the LED as the current distribution layer, wherein the aforementioned very thin metallic film is capable of allowing the passage of light, and the aforementioned transparent conducting film is composed of ITO and other oxides.

Another way to reduce the adverse effect of the electrode pad is provided by a flip chip structure. This method is effective for the LED having no substrate for absorbing light. Both the p-type electrode and n-type electrode are placed on the same surface, and metals of high reflection factor are used as one or both of the electrodes. Further, these metals are used to cover almost all of the surfaces.

The light produced on the active layer is reflected by the electrode. Light is taken out of the surface where the electrode of the substrate is not mounted. When this method is used, there is no disadvantage of cost increase for growth or absorption of light by the current distribution layer, unlike the cases where the current distribution layer of the semiconductor is provided.

From the above discussion, it can be seen that a combination of the following two methods is effective in improving the light extraction efficiency of the LED without causing cost increase: The first method is "to roughen the surface of the LED structure, thereby (1) applying transparent metal or oxide films as current distribution layers.

The second method is "to roughen the surface of the LED structure, thereby (2) forming a flip chip structure". As is also apparent from the above discussion, to make full use of the effect of roughening the surface, it is necessary to reduce absorption of light on the active layer.

However, serious difficulties follows in most cases when the aforementioned (1) or (2) and the method of roughening the surface of the LED is used in combination in practice.

For example, in Non-patent Document 4, the aforementioned electrode for covering the entire surface of the electrode is not provided. Only a part of the surface is provided. This can be assumed as follows: As shown in FIG. 19.2 of the Non-patent Document 4, the level difference in the concavo-convex pattern on the surface is 20 μm or more. This makes it difficult to form a thin transparent conductive film over the entire surface, without dividing it into sections.

The present inventors attempted experiments to corroborate the method of forming a concavo-convex pattern on the surface of the LED by encouraging growth of Mg-doped or Si-doped GaN on the GaN-based LED structure, as shown in the sixth example of the Patent Document 1 or in FIGS. 3(B), 4(B), 5(B) and 6(B) of Patent Document 2. It has been revealed that, when the GaN layer of normal doping density capable of providing a GaN layer of low resistance is made to grow, it is necessary to grow a GaN layer of about 2 μm in order to form a concavo-convex pattern sufficient to improve the light extraction efficiency.

This is accompanied by excessive absorption of light by the Mg doped GaN or Si-doped GaN layer, and the light extraction efficiency is reduced by any of the aforementioned methods (1) and (2), against expectation.

According to the aforementioned method (1), a film having a thickness of about 100 nm or less is usually used as a transparent electrode. This is intended to reduce absorption of light by the transparent electrode.

Thus, it is impossible to achieve continuous formation of a transparent conductive film when using the surface configuration shown in FIGS. 3(B), 4(B), 5(B) and 6(B) of Patent Document 2, namely, the surface configuration wherein a concavo-convex pattern (height>100 nm) is provided to improve light extraction efficiency and the surface is completely devoid of any flat portion.

In this case, current cannot be distributed over the entire surface, with the result that the light emitting capacity of the LED cannot be improved effectively. Further, when the current distribution is insufficient as in this case, the light emitting output is reduced below the LED having a flat surface in most cases.

According to T. Riemann et al. "Proceedings of International Workshop on Nitride Semiconductor", IPAP Conf. Series 1 pp. 280-283 (Non-patent Document 6) and the result of studies by the present inventors, when a concavo-convex pattern is formed on the surface by growth, the slope of the concavo-convex pattern is turned into an n-type of high density by the autodoping of an impurity contained in the atmosphere for growth.

The GaN-based LEDs having been reported so far has a p-type GaN layer formed on the surface in almost all cases. The Mg material ($Cp_2Mg$) used as a p-type material tends to remain inside the growth apparatus. If the p-type semiconducting layer grows earlier than the active layer, Mg will be mixed into the active layer and light emitting output is reduced. This explains why p-type semiconducting layer is used as the topmost layer.

If the method shown in the sixth embodiment of the Patent Document 1 or in FIGS. 3(B) and 4(B) of the Patent Document 2 is applied to the embodiment of such a normal GaN-based LED, and the surface configuration shown in FIGS. 3(B) and 4(B) of the Patent Document 2 is formed (where only a slope is present on the surface), then the extreme surface of the LED will be turned into an n-type (instead of p-type) by the aforementioned autodoping.

If the concavo-convex pattern on the surface is formed by etching, the surface having chemical properties different from those of the flat portion occurs on the slope of the bore. Generally when a metallic electrode is formed on the surface having different chemical properties, the properties are changed.

It does not necessarily follow that an electrode of low contact resistance required by the LED is formed on each of the flat surface and the slope of the bore under the same conditions for electrode formation. In an extreme case, even under the conditions for electrode formation capable to providing a low contact resistance on a flat surface, a Schottky type electrode having a commutation property may be formed on the slope of a bore in some cases.

In such cases, the drive voltage is increased to an extremely high level even when the LED is energized. Light emitting output is reduced to a very low level due to heat generation, even by using any of the aforementioned methods (1) and (2).

As described above, a technique has not yet been established to ensure compatibility between the method of improving the light extraction efficiency by roughening the surface of the LED structure, and the method of avoiding the adverse effect of a low-cost electrode pad ((1) forming a current distribution layer by the transparent conductive film made of metal or metal oxide, and (2) forming a flip chip structure).

The above description refers to the examples of the GaN-based LED. The problems that occur in joint use of the method of roughening the surface and the method of the aforementioned (1) and (2) also arise in other semiconductors. The following description applies to the GaN-based LED as well as the LEDs composed of other semiconductors.

SUMMARY OF THE INVENTION

The object of the present invention is to provide a technique of ensuring compatibility between the method of improving the light extraction efficiency by roughening the surface of the LED structure, and the method of avoiding the adverse effect of a low-cost electrode pad ((1) forming a current distribution layer by the transparent conductive film made of metal or metal oxide, and (2) forming a flip chip structure).

The light emitting diode of the present invention comprises at least an n-type semiconducting layer, an active layer composed of 30 or less quantum well layers, and a p-type semiconducting layer provided on a substrate, and is characterized in that:

the surface of the semiconductor lamination structure (the surface opposite to the surface where the semiconductor lamination structure contacts the substrate) contains a flat portion and a plurality of bores;

the in-plane coverage rate ((the area of the bore opening/surface area)×100) of the plurality of the bores is 10% or more without exceeding 85%;

the opening of the bore has a diameter of 100 nm or more without exceeding 4000 nm;

the depth of the bore is smaller than the distance between the active layer and the flat portion; and the density of the plurality of the bores expressed in terms of number of bores is $8\times10^5$ per/cm$^2$ or more without exceeding $1.08\times10^{10}$ per/cm$^2$.

As described above, a concavo-convex pattern is formed on the surface of the semiconductor lamination structure. Not only that, a flat portion is maintained on the surface of the semiconductor lamination structure, thereby preventing the p-type semiconducting layer from being turned into the n-type semiconducting layer by the aforementioned doping, and avoiding high contact resistance.

The active layer is composed of 30 or less quantum well layers, whereby re-absorption of light on the active layer is reduced and effective improvement of the light extraction efficiency is ensured. Further, the depth of the bore is kept smaller than the distance between the active layer and flat portion, thereby preventing occurrence of a short circuit between the electrode and light emitting area (active layer).

When the bore has reached the light emitting area (active layer) of the light emitting diode, a short circuit occurs between the electrode and light emitting area (active layer) when an electrode is formed on the surface of the bore. The light emitting diode emits light when voltage is applied to the pn junction. If a short circuit occurs between the electrode and light emitting area (active layer), light is not emitted.

The light emitting diode of the present invention is preferably characterized in that a transparent conductive film is formed on the surface of the semiconductor lamination structure; an electrode pad is formed on part of the surface of the transparent conductive film; and light is emitted from the transparent conductive film.

As described above, a transparent conductive film is formed on the surface of the semiconductor lamination structure with the flat portion maintained. This structure prevents the transparent conductive film from being divided into sections to cause current distribution failure, when a transparent conductive film is formed on the surface of the semiconductor lamination structure.

The light emitting diode of the present invention is preferably characterized in that an electrode pad is formed on the surface of the semiconductor lamination structure, and light is emitted from the side of the substrate.

The light emitting diode of the present invention is preferably characterized in that the opening of the bore is circular or polygonal. The diameter when the opening of the bore is circular or polygonal signifies the diameter of the circumscribed circle of the polygon.

The light emitting diode of the present invention is preferably characterized in that the depth of the bore is 100 nm or more without exceeding 1000 nm.

The light emitting diode of the present invention is preferably characterized in that the bore is conical or multi-pyramidal.

The light emitting diode of the present invention is preferably characterized in that the n-type semiconducting layer and p-type semiconducting layer are composed of nitride semiconductor.

The light emitting diode of the present invention is preferably characterized in that the quantum well layer is composed of a well layer containing $In_xAl_yGa_zN$ (where $0 \leqq x, y, z \leqq 1$, $x+y+z=1$), and a barrier layer containing $In_aAl_bGa_cN$ (where $0 \leqq a, b, c \leqq 1, a+b+c=1$), having a different composition from that of the well layer, and a greater band gap energy than the well layer.

The light emitting diode of the present invention is preferably characterized in that the well layer is not doped, and the barrier layer is of n-type.

The light emitting diode of the present invention is preferably characterized in that the n-type semiconducting layer and/or p-type semiconducting layer is composed of a plurality of layers having different doping densities or compositions.

The light emitting diode of the present invention is preferably characterized in that the n-type semiconducting layer contains an undoped GaN layer and an n-type GaN layer.

The light emitting diode of the present invention is preferably characterized in that the p-type semiconducting layer includes a p-type AlGaN layer and a p-type GaN layer.

The light emitting diode of the present invention is preferably characterized in that the n-type semiconducting layer is formed between the p-type semiconducting layer and substrate.

The light emitting diode of the present invention is preferably characterized in that the p-type semiconducting layer is formed between the n-type semiconducting layer and substrate.

The light emitting diode of the present invention is preferably characterized in that the substrate is composed of sapphire, SiC, GaN, AlN and ZnO.

A light emitting diode manufacturing method (manufacturing method 1) of the present invention comprises:

a step of forming the semiconductor lamination structure by sequentially laminating at least an n-type semiconducting layer, an active layer composed of 30 or less quantum well layers, and a p-type semiconducting layer on a substrate; and a step of forming a flat portion and a plurality of bores by etching the surface of the semiconductor lamination structure (the surface opposite to the surface where the semiconductor lamination structure contacts the substrate), wherein:

an in-plane coverage rate ((bore opening area)/surface area)×100) of the bores is 10% or more without exceeding 85%;

the opening of the bore has a diameter of 100 nm or more without exceeding 4000 nm;

the depth of the bore is smaller than the distance between the active layer and the flat portion; and the density of the plurality of the bores expressed in terms of number of bores is $8 \times 10^5$ per/cm$^2$ or more without exceeding $1.08 \times 10^{10}$ per/cm$^2$.

The light emitting diode manufacturing method (manufacturing method 1) of the present invention preferably comprises, after the bore forming step:

a step of forming a transparent conductive film on the surface of the semiconductor lamination structure; and a step of forming an electrode pad on part of the surface of the transparent conductive film.

Alternatively, this light emitting diode manufacturing method preferably contains a step of forming an electrode pad on the surface of the semiconductor lamination structure, after the bore forming step.

The light emitting diode manufacturing method (manufacturing method 1) of the present invention is preferably characterized in that the etching is provided by wet etching method or electrochemical method using a solution containing at least one of $H_2SO_4$, $H_3PO_4$, HCl, KOH, and NaOH.

The light emitting diode manufacturing method (manufacturing method 1) of the present invention is preferably characterized in that the etching is provided by dry etching method using a gas containing at least one of HCl, $Cl_2$, $SF_6$, $BCl_3$ and $CH_4$.

A light emitting diode manufacturing method (manufacturing method 2) is characterized in that a semiconductor lamination structure is formed by sequential lamination of:

an n-type semiconducting layer containing an n-type impurity density doped layer, the n-type impurity density being $5 \times 10^{18}$ /cm$^2$ or more, and the film thickness being 1 μm or more;

an active layer composed of 30 or less quantum well layers; and a p-type semiconducting layer; the layers being laminated in that order on the substrate;

whereby a flat portion and a plurality of bores are formed on the surface of the semiconductor lamination structure (the surface opposite to the surface where the semiconductor lamination structure contacts the substrate) in such a way that:

the in-plane coverage rate ((bore opening area)/surface area)×100) of the plurality of the bores is 10% or more without exceeding 85%;

the opening of the bore has a diameter of 100 nm or more without exceeding 4000 nm;

the depth of the bore is smaller than the distance between the active layer and the flat portion; and the density of the plurality of the bores expressed in terms of number of bores is $8 \times 10^5$ per/cm$^2$ or more without exceeding $1.08 \times 10^{10}$ per/cm$^2$.

A light emitting diode manufacturing method (manufacturing method 3) comprises a step of sequentially forming:

an n-type semiconducting layer;

an active layer composed of 30 or less quantum well layers; and a p-type semiconducting layer containing a p-type bore forming layer formed in such a way that:

the substrate temperature Tg is 1000 degrees Celsius or less;

the film thickness is 100 nm or more without exceeding 1 μm; and the relationship between the substrate temperature Tg and p-type impurity density (unit:/cm$^3$) can be expressed by p-type impurity density $> 4.58 \times 10^{18} e^{0.00211 Tg}$; the layers being formed sequentially in that order;

the light emitting diode manufacturing method further comprising a step of forming a flat portion and a plurality of bores on the surface of the semiconductor lamination structure (the surface opposite to the surface where the semiconductor lamination structure contacts the substrate) in such a way that:

the in-plane coverage rate ((bore opening area)/surface area)×100) of the plurality of the bores is 10% or more without exceeding 85%;

the opening of the bore has a diameter of 100 nm or more without exceeding 4000 nm;

the depth of the bore is smaller than the distance between the active layer and the flat portion; and the density of the plurality of the bores expressed in terms of number of bores is $8 \times 10^5$ per/cm$^2$ or more without exceeding $1.08 \times 10^{10}$ per/cm$^2$.

The light emitting diode manufacturing methods (manufacturing methods 2 and 3) comprise, after the bore forming step;

a step of forming a transparent conductive film on the surface of the semiconductor lamination structure; and a step of forming an electrode pad on part of the surface of the transparent conductive film.

Alternatively, these light emitting diode manufacturing methods preferably contains a step of forming an electrode pad on the surface of the semiconductor lamination structure, after the bore forming step.

A light emitting diode manufacturing method (manufacturing method 4) comprises:

a step of forming the semiconductor lamination structure by sequentially laminating at least an n-type semiconducting layer, an active layer composed of 30 or less quantum well layers, and a p-type semiconducting layer on a substrate;

a step of forming a metallic film (an independent film or composite film) containing a metal selected from among Ni, W, Al, Ti, Au, Pt, Pd and In and having a thickness of 0.5 nm or more without exceeding 100 nm, on the surface of the semiconductor lamination structure (the surface opposite to the surface where the semiconductor lamination structure contacts the substrate);

a step of forming a flat portion and a plurality of bores on the surface of the semiconductor lamination structure by heat treatment of the semiconductor lamination structure with the metallic film formed thereon, in such a way that:

an in-plane coverage rate ((the area of the bore opening/surface area)×100) of the bores is 10% or more without exceeding 85%;

the opening of the bore has a diameter of 100 nm or more without exceeding 4000 nm;

the depth of the bore is smaller than the distance between the active layer and the flat portion; and the density of the plurality of the bores expressed in terms of number of bores is $8 \times 10^5$ per/cm$^2$ or more without exceeding $1.08 \times 10^{10}$ per/cm$^2$.

The light emitting diode manufacturing method (manufacturing method 4) preferably comprises, after the bore forming step:

a step of forming a transparent conductive film on the surface of the semiconductor lamination structure; and a step of forming an electrode pad on part of the surface of the transparent conductive film.

Alternatively, this light emitting diode manufacturing method preferably contains a step of forming an electrode pad on the surface of the semiconductor lamination structure, after the bore forming step.

The light emitting diode manufacturing method (manufacturing method 4) is preferably characterized in that the temperature for the heat treatment is 800 degrees celsius or more without exceeding 1300 degrees celsius, and the atmosphere for heat treatment comprises any one of a gas consisting of ammonium alone, a mixed gas of ammonium and hydrogen, a mixed gas of ammonium and nitrogen, and a mixed gas of ammonium, hydrogen and nitrogen.

The light emitting diode manufacturing method (manufacturing method 4) is preferably characterized in that subsequent to the heat treatment, the metallic film is removed by acid solution or alkali solution.

The light emitting diode manufacturing method (manufacturing method 4) is preferably characterized in that the metallic film is a composite metallic film formed by lamination of a plurality of metals.

The light emitting diode manufacturing methods (manufacturing methods 1, 2, 3 and 4) are preferably characterized in that the transparent conductive film contains at least one of Ni, Au, ITO and ZnO.

The light emitting diode manufacturing methods (manufacturing methods 1, 2, 3 and 4) are preferably characterized in that, after the bore forming step, at least one of the opening of the bore and depth is increased by wet etching method using a solution containing at least one of $H_2SO_4$, $H_3PO_4$, HCl, KOH, and NaOH.

The light emitting diode manufacturing methods (manufacturing methods 1, 2, 3 and 4) are preferably characterized in that only the flat portion is covered with a transparent conductive film.

As described above, a concavo-convex pattern is formed on the surface of the semiconductor lamination structure. Not only that, a flat portion is maintained on the surface of the semiconductor lamination structure, thereby preventing the p-type semiconducting layer from being turned into the n-type semiconducting layer by the aforementioned doping, and avoiding high contact resistance. The active layer is composed of 30 or less quantum well layers, whereby re-absorption of light on the active layer is reduced and effective improvement of the light extraction efficiency is ensured.

Further, the surface of the semiconductor lamination structure is composed of a flat portion and a plurality of bores. The in-plane coverage rate of the bores is 10% or more without exceeding 85%. A transparent conductive film on the surface of the semiconductor lamination structure. This arrangement prevents the transparent conductive film from being divided into sections until current distribution failure occurs.

The present invention provides a technique of ensuring compatibility between the method of improving the light extraction efficiency by roughening the surface of the LED structure, and the method of avoiding the adverse effect of a low-cost electrode pad ((1) forming a current distribution layer by the transparent conductive film made of metal or metal oxide, and (2) forming a flip chip structure).

DESCRIPTION OF THE INVENTION

Figure 1:
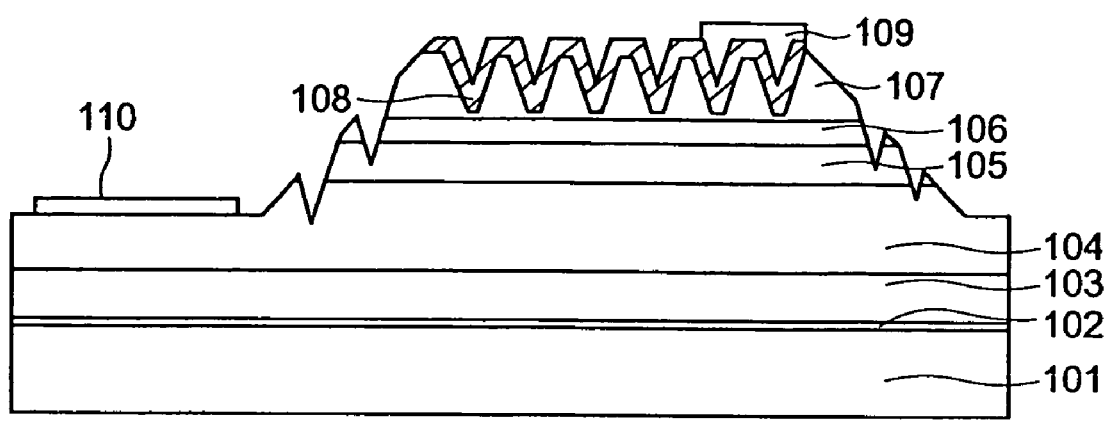
FIG. 1 is a cross sectional view of a light emitting diode provided with a current distribution layer formed of a transparent conductive film made of metal or metal oxide in an embodiment (Embodiment 1) of t he present invention.

Best Form of Embodiment of the Present Invention

In the light emitting diode of the present invention, the number of the quantum well layers is preferably 30 or less, more preferably 12 or less, and still more preferably 6 or less. This is because, when the number of the quantum well layers is 30 or less, the light emitting output of the LED structure with bores formed on the surface thereof is higher than that of the LED structure having a flat surface. Especially when the number of the quantum well layers is 12 or less, the rate of output increase is 1.5 or more. Further, if the number of the quantum well layers is 6 or less, the rate of output increase is 2 or more.

The following describes the details of the present invention with reference to embodiments, without the present invention being restricted thereto.

Embodiment 1

The method of manufacturing the prior art light emitting diode (LED) as a basis will be first described with reference to FIGS. 15 and 16.

According to the MOVPE method, a LED structure emitting blue light was grown on a substrate (501 or 601), having a diameter of 2 inches, composed of a sapphire with surface C. To put it more specifically, a substrate (501 or 601) composed of sapphire was put into a MOVPE apparatus. Then it was heated in the atmosphere of a nitrogen/hydrogen mixed gas of 760 Torr (overall flow rate=150 slm; nitrogen/hydrogen=2) at 1135 degrees Celsius for 10 minutes, whereby the oxides were removed from the surface of the substrate (by thermal cleaning).

After that, the substrate temperature was reduced to 515 degrees Celsius. At the same time, the flow rate of the carrier gas was set at 140 slm and volume ratio of nitrogen/hydrogen in the carrier gas was set at 1.5. Under this condition, ammonia ($NH_3$) gas as a nitrogen material was put into the growth apparatus at a flow rate of 10 slm. Further, trimethyl gallium (TMG) as a material of Ga was put into the growth apparatus and a low-temperature growth buffer layer (502 or 602) composed of GaN was grown to 22 nm on the substrate at a growth rate of 1.6 µm/hour.

Then the flow rate of the carrier gas was set at 80 slm, a volume ratio of the nitrogen/hydrogen in the carrier gas at 1, the flow rate of the ammonia gas at 20 slm, and the substrate temperature at 1075 degrees Celsius. Under this condition, an undoped GaN layer (503 or 603) was grown to a film thickness of 2 µm at a growth rate of 4 µm/hour. Then a Si doped n-type GaN layer (504 or 604) having a Si density of $3\times10^{18}$ $cm^{-3}$ was grown thereon to a thickness of 4 µm.

After that, the substrate temperature was raised to 750 degrees Celsius, and InGaN/GaN multiple quantum well layer (active layer) (505, 605) was formed, wherein this InGaN/GaN multiple quantum well layer was composed of a 6-cycle Si doped n-type GaN layer having a density of undoped $In_{0.15}Ga_{0.85}N$ quantum well layer (film thickness: 3.5 nm)/Si of $3\times10^{18}$ $cm^{-3}$.

Then the substrate temperature was again set at 1075 degrees Celsius, and a p-type $Al_{0.1}Ga_{0.9}N$ layer (506, 606) having a Mg density of $3\times10^{19}$ $cm^{-3}$ was grown to a film thickness of 35 nm and p-type GaN layer (507, 607) having a Mg density of $5\times10^{19}$ $cm^{-3}$ was grown to a film thickness of 200 nm.

Then part of an epitaxial wafer was etched to reach the n-type GaN layer (504, 604) by a reactive ion etching (RIE) apparatus. Here the slope in the area having unremoved by etching formed a s tilted surface, not a perpendicular surface, as shown in FIG. 1. The second electrode pad (Ti (film thickness: 200 nm)/Al(film thickness: 2000 nm) (510, 610) was formed on the bottom of the area treated by etching.

For part of the epitaxial wafer, a transparent conductive film (Ni (film thickness: 2 nm)/Au(film thickness: 6 nm) (508) and a first electrode pad (Ni (film thickness: 20 nm)/Au (film thickness: 5000 nm) (509) were formed thereafter. A LED structure (hereinafter referred to as "surface light extraction type LED structure") was produced, wherein a current distribution layer was formed using a transparent conductive film made of a metal or metal oxide shown in FIG. 15. For other portions of the epitaxial wafer, the first electrode pad (Ag: (film thickness: 5000 nm) (609) is formed on the LED surface.

Figure 16:
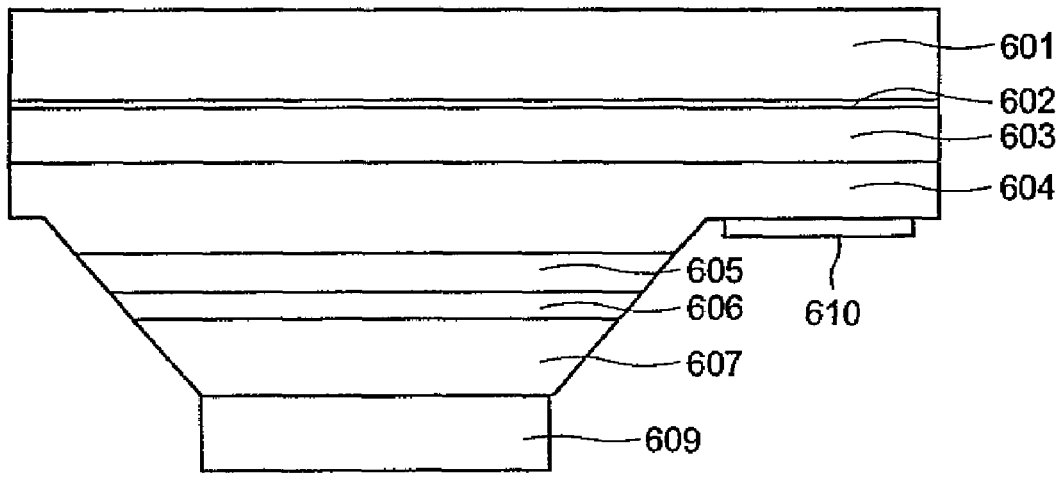
FIG. 16 is a cross sectional view of a light emitting diode of flip chip type structure in a prior art.

The a LED structure where a flip chip structure shown in FIG. 16 is formed was manufactured (hereinafter referred to as "flip chip type LED structure"). In the following description, these LED structures will be called a surface light extraction type LED structure and a flip chip type LED structure, respectively. They are collectively called a "prior art LED structure".

Figure 9:
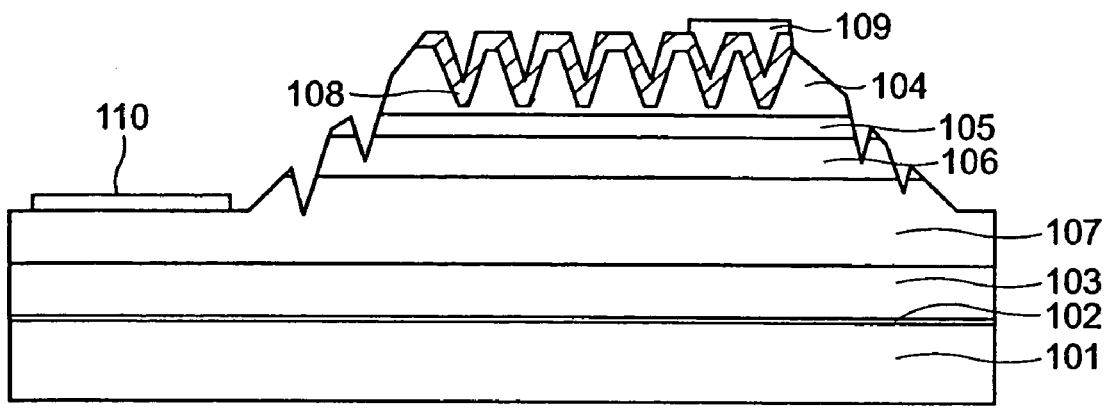
FIG. 9 is a cross sectional view of a light emitting diode provided with a current distribution layer formed of a transparent conductive film made of metal or metal oxide in a further embodiment (Embodiment 5) of the present invention.
Figure 15:
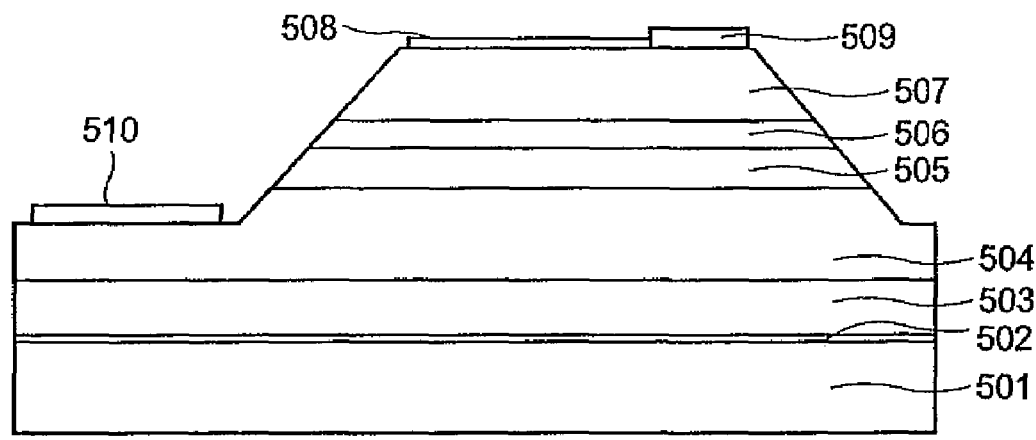
FIG. 15 is a cross sectional view of a light emitting diode provided with a current distribution layer formed of a transparent conductive film made of metal or metal oxide in a prior art.

The light emission output of these LEDs when energized at 20 mA was 4 mW in the case of the surface light extraction type LED structure of FIG. 15, and 9 mW in the case of the flip chip type LED structure of FIG. 16.

Then several types of similar epitaxial wafers were manufactured, wherein a thickness of the p-type GaN layer alone (507, 607) was 200 nm through 3000 nm. Their surfaces were etched in a solution of sulfuric acid and phosphoric acid so that bores were formed on their surface. The temperature of the solution at the time of etching was 100 through 180 degrees Celsius, and etching time was 10 minutes through 2 hours.

Figure 3:
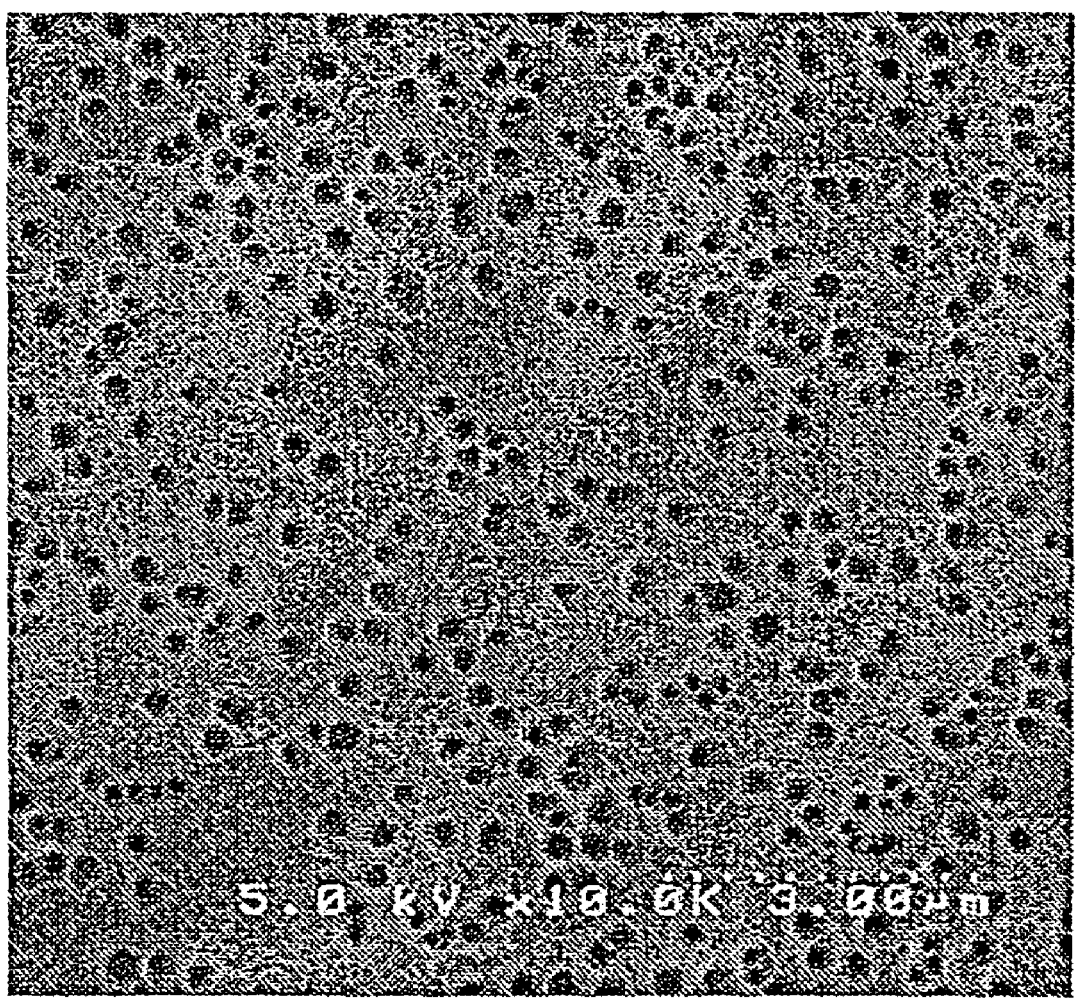
FIG. 3 is a figure-equivalent photo representing the surface of the epitaxial wafer having a plurality of bores formed thereon by etching p-type GaN layer surface in an embodiment (Embodiment 1) of the present invention.

FIG. 3 shows an example of the surface of the epitaxial wafer having been etched. As can be seen in FIG. 3, the surface formed on this etching was composed of many bores and a flat surface. Depending on the etching conditions, the bore density varied in the range from $1 \times 10^5/cm^2$ through $5 \times 10^{10}/cm^2$.

Further, the shape of the bore opening depends on the etching conditions, and is available in many types such as a circle, a hexagon and a dodecagon. The bore itself was conical and pyramidal based on these shapes used on the top surface. The bore depth was in the range from approximately the diameter of the circumscribed circle through ¼ thereof. The bore diameter and depth varied in the range from 50 through 5000 nm and 30 through 5000 nm, respectively, depending on the etching temperature and time.

The aforementioned conditions were variously combined to manufacture epitaxial wafers having various forms of surfaces wherein the percentage of the area occupied by the opening on the surface was within the range from 0% (without etching) through 100% (without any flat portion). Thus, a surface light extraction type LED structure and flip chip type LED structure were manufactured, similarly to the case of the aforementioned prior art example (FIGS. 15 and 16).

Figure 2:
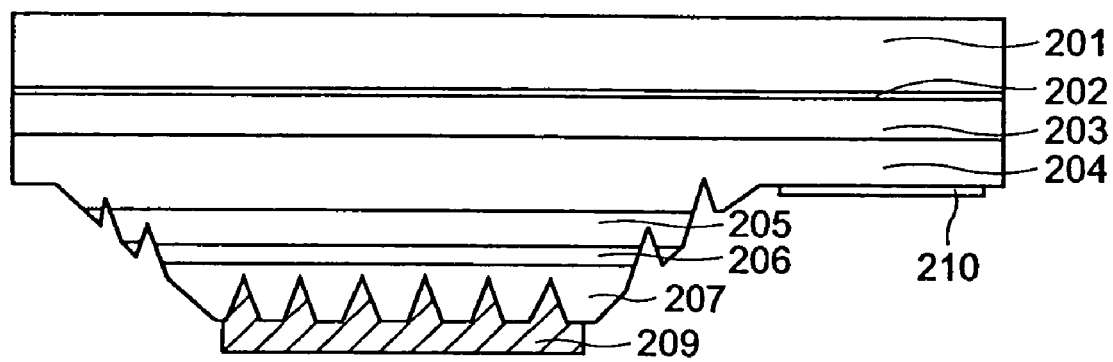
FIG. 2 is a cross sectional view of a light emitting diode of flip chip type structure in an embodiment (Embodiment 1) of the present invention.

When the epitaxial wafer with the aforementioned bores formed thereon was treated by etching according to the RIE method, as shown schematically in FIGS. 1 and 2, the aforementioned bores remained on the slope in the area not removed by RIE, and a slope having a concavo-convex pattern was formed. The density of the bore on the slope the bore diameter as viewed from the top was almost the same as the initial levels.

In the surface light extraction type LED structure of the present invention, a transparent conductive film was formed by vapor deposition up to the interior of the bore, as shown in FIG. 1. A first electrode pad (109, 209) and a second electrode pad (110, 210) are provided as shown in FIGS. 1 and 2.

Some of these LEDs exhibited an obvious increase in the light emitting output as compared to that of the prior art LED structure. The light emitting output was increased up to a maximum of twice that of the prior art LED structure. However, some of the LEDs exhibited the light emitting output equal to or smaller than that of the prior art LED structure. Still some other LEDs emitted no light at all.

The following describes the forms of bores observed in the LED with its light emitting output having been increased:

1) The percentage of the area occupied by the opening on the surface of the LED structure was 10% or more without exceeding through 85%.

2) The diameter of the circumscribed circle of the bore is 100 nm or more without exceeding 4000 nm, and the bore depth was 100 nm or more without exceeding 1000 nm and smaller than the overall thickness of the p-type semiconducting layer (distance between active layer and flat portion).

3) The bore density was $8 \times 10^5$ per/cm$^2$ or more without exceeding $1.08 \times 10^{10}$ per/cm$^2$.

In the meantime, the LEDs that did not emit any light is those LED wherein bore depth is greater than the overall thickness of the p-type GaN layer (distance between active layer and flat portion). This is because a short circuit has occurred between the transparent conductive film and light emitting layer, as described above.

For the LED wherein the overall thickness of the p-type GaN layer is greater than 1000 nm, the light emitting output was reduced below the prior art LED structure, independently of the bore density, depth or diameter. This is because absorption of light on the p-type GaN layer became excessive. To put it another way, the effect of improving the light emitting output cannot be obtained even if the bore depth is 1000 nm or more and the p-type GaN layer is grown to an overall thickness of 1000 nm or more in order to prevent occurrence of the aforementioned short circuit.

Further, when the bore diameter was less than 100 nm, and the bore depth was less than 100 nm, there was almost no difference in the light emitting output from that of the prior art LED structure. This can be explained by assuming that the bore diameter and depth were small as compared to light wavelength and light is scattered from the bore, with the result that the effect of improving the light extraction efficiency could be obtained.

When the percentage of the area occupied by the bore opening on the surface of the LED structure was less than 10%, the light emitting output was almost the same as that of the prior art type.

When the percentage of the area occupied by the opening on the surface was greater than 85%, the transparent conductive film was divided into sections in the surface light extraction type LED structure, and the entire LED could not be energized, with the result that light emitting output was reduced below the prior art LED structure.

Further, in the flip chip type LED structure, when the percentage of the area occupied by the opening on the surface was greater than 85%, the light emitting output was reduced below the prior art LED structure. This is because the percentage occupied by the slope of the bore on the surface increased so that electrode contact resistance also increased. Thus, when a current of 20 mA was applied, the voltage of 3.3 volts in the prior art LED structure rose to 5.1 volts, and excessive heat generation occurred to the device.

Embodiment 2

In the LED structure of the first embodiment, epitaxial wafers were manufactured wherein the number of undoped $In_{0.15}Ga_{0.85}N$ layers in the InGaN/GaN multiple quantum well layer (active layer) (105, 205) is 1 through 50. A prior art surface light extraction type LED structure and a surface light extraction type LED structure having bores were formed on the surface in the manner similar to the first embodiment were manufactured from each epitaxial wafer.

Figure 4:
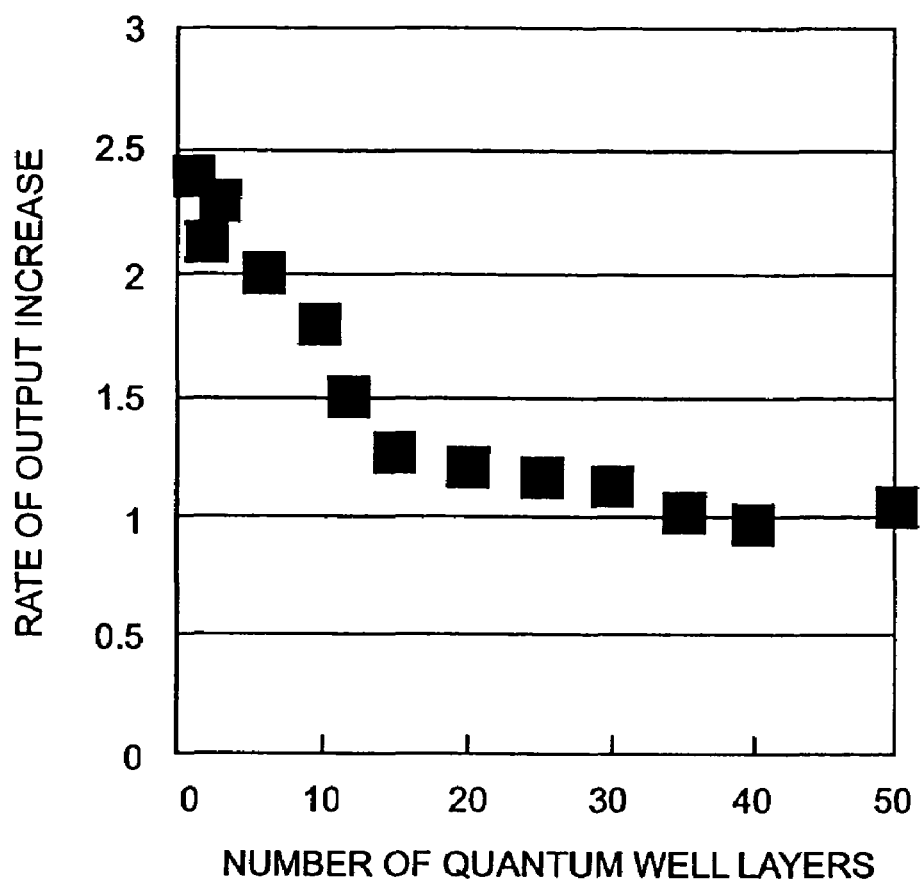
FIG. 4 is a drawing representing the relationship between the number of quantum wells and the rate of output increase in another embodiment (Embodiment 2) of the present invention.

FIG. 4 shows the number of the quantum well layers and the rate of output increase (the maximum light emitting output obtained from the LED structure with bores formed on the surface/outputted light emitting output of the prior art LED structure) resulting from formation of bores on the surface. As shown in FIG. 4, when the number of the quantum well layers is more than 30, the light emitting output is not increased even if bores are formed on the surface (the rate of output increase: 1 or less).

This is due to an increase in the absorption of light by the active layer, as described above. If the number of the quantum well layers is 30 or less, the light emitting output of the LED structure with bores formed on the surface becomes higher than that of the LED structure having a flat surface. Especially when the number of the quantum well layers is 12 or less, the rate of output increase is 1.5 or more. Further, if the number of the quantum well layers is 6 or less, the rate of output increase was 2 or more.

Embodiment 3

Figure 5:
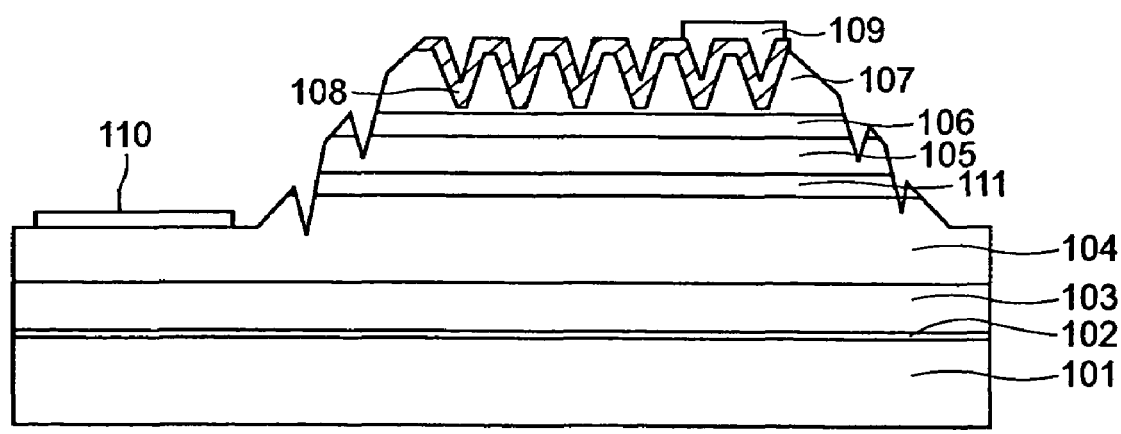
FIG. 5 is a cross sectional view of a light emitting diode provided with a current distribution layer formed of a transparent conductive film made of metal or metal oxide in a further embodiment (Embodiment 3) of the present invention.
Figure 6:
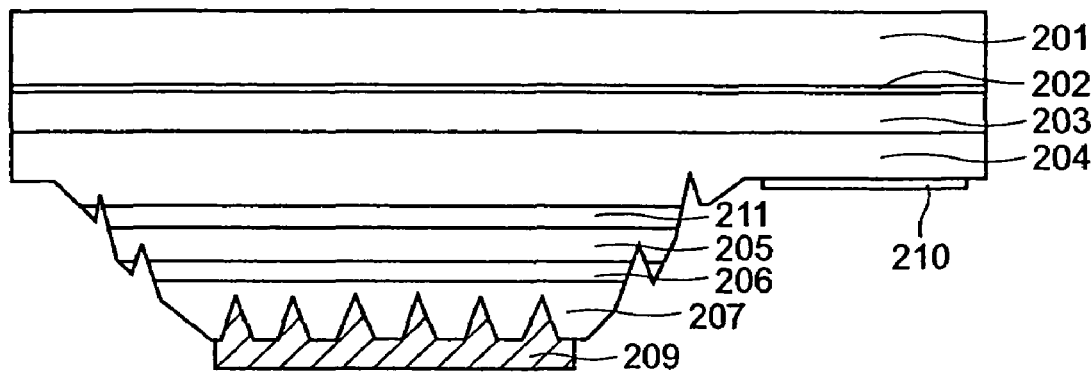
FIG. 6 is a cross sectional view of a light emitting diode of flip chip type structure in a further embodiment (Embodiment 3) of the present invention.

As shown in FIGS. 5 and 6, in the LED structure of the first embodiment, a Si doped n-type $Al_{0.1}Ga_{0.9}N$ layer (111, 211) having a Si density of $3\times10^{18}$ cm$^{-3}$ was inserted between the n-type GaN layer (104, 204) and InGaN/GaN multiple quantum well layer (active layer) (105, 205).

An epitaxial wafer for a blue-violet LED (emitted light wavelength: 400 nm) was manufactured, wherein the active layer of this blue-violet LED was an InGaN/GaN multiple quantum well layer (active layer) (105, 205), this InGaN/GaN multiple quantum well layer being composed of a 6-cycle, Si doped n-type GaN layer having a density of undoped $In_{0.06}Ga_{0.94}N$ (film thickness: 3.5 nm)/Si of $3\times10^{18}$ cm$^{-3}$.

Then the same experiment as that in the first embodiment was conducted. Similarly to the case of the first embodiment, a considerable increase was observed in the light emitting output over the prior art LED structure under the following conditions:

1) The percentage of the area occupied by the opening on the surface of the LED structure was 10% or more without exceeding through 85%.

2) The diameter of the circumscribed circle of the bore is 100 nm or more without exceeding 4000 nm, and the bore depth was 100 nm or more without exceeding 1000 nm and smaller than the overall thickness of the p-type semiconducting layer (distance between active layer and flat portion).

3) The bore density was $8\times10^5$ per/cm$^2$ or more without exceeding $1.08\times10^{10}$ per/cm$^2$.

Embodiment 4

Figure 7:
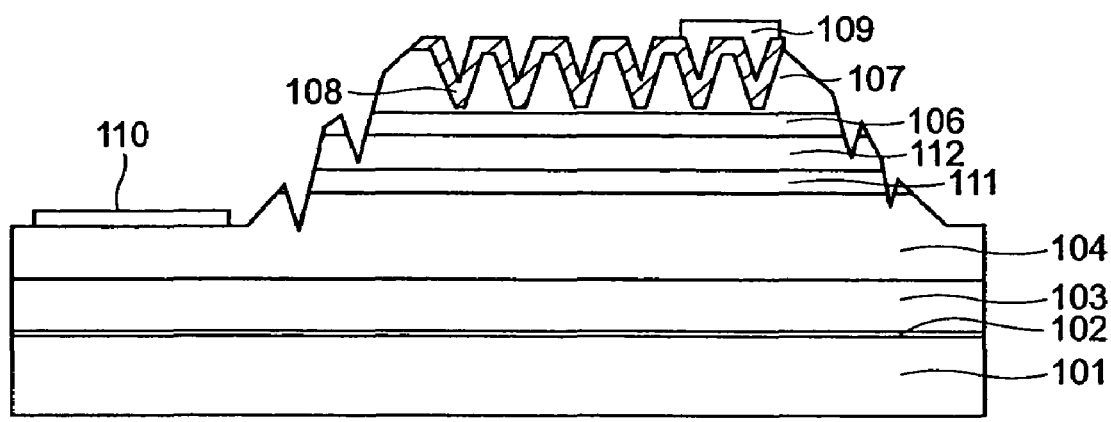
FIG. 7 is a cross sectional view of a light emitting diode provided with a current distribution layer formed of a transparent conductive film made of metal or metal oxide in a further embodiment (Embodiment 4) of the present invention.
Figure 8:
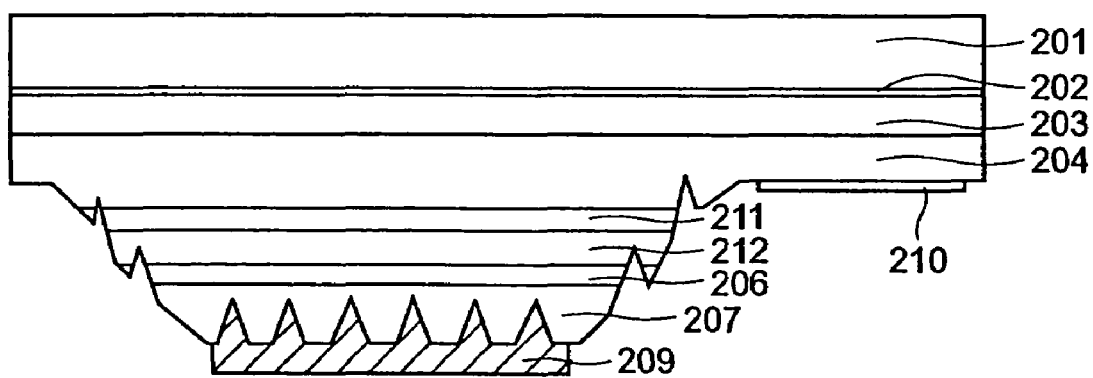
FIG. 8 is a cross sectional view of a light emitting diode of flip chip type structure in a further embodiment (Embodiment 4) of the present invention.

As shown in FIGS. 7 and 8, in the LED structure shown in the third embodiment, an epitaxial wafer (emitted light wavelength: 320 through 395 nm) for ultraviolet LED was manufactured. This wafer is composed of:

a well layer wherein the multiple quantum well layer was expressed by $In_xAl_yGa_zN$ (where $0 \leq x, y, z \leq 1$, $x+y+z=1$); and an InAlGaN/InAlGaN multiple quantum well layer (active layer) (112, 212) consisting of a barrier wall expressed by $In_aAl_bGa_cN$ (where $0 \leq a, b, c \leq 1$, $a+b+c=1$), having a different structure from the above and a greater band gap than the well layer. Then the same experiment as that in the first embodiment was conducted. Similarly to the case of the first embodiment, a considerable increase was observed in the light emitting output over the prior art LED structure under the following conditions:

1) The percentage of the area occupied by the opening on the surface of the LED structure was 10% or more without exceeding through 85%.

2) The diameter of the circumscribed circle of the bore is 100 nm or more without exceeding 4000 nm, and the bore depth was 100 nm or more without exceeding 1000 nm and smaller than the overall thickness of the p-type semiconducting layer (distance between active layer and flat portion).

3) The bore density was $8\times10^5$ per/cm$^2$ or more without exceeding $1.08\times10^{10}$ per/cm$^2$.

Embodiment 5

Figure 10:
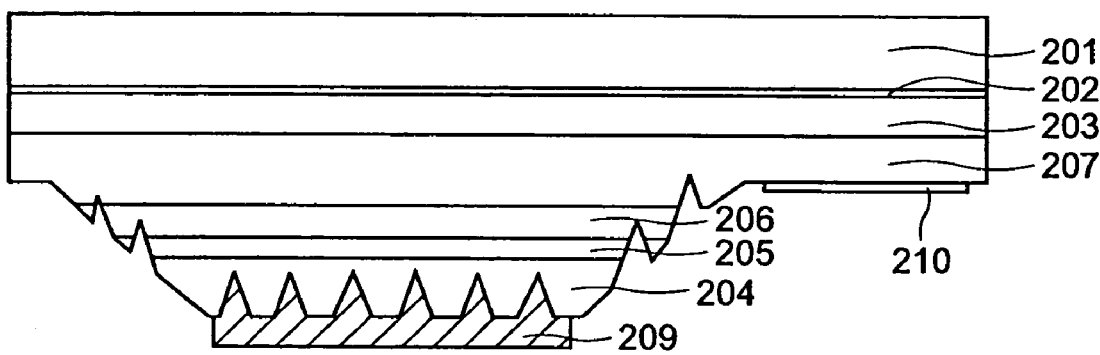
FIG. 10 is a cross sectional view of a light emitting diode of flip chip type structure in a further embodiment (Embodiment 5) of the present invention.

As shown in FIGS. 9 and 10, an epitaxial wafer for blue LED having the n-type GaN layer at the topmost layer was grown using the same conditions for growth as those of the first embodiment. To put it more specifically, a low-temperature growth buffer layer (102, 202) composed of GaN, a undoped GaN layer (film thickness: 2 μm) (103, 203), and a Mg doped P-type $Al_{0.1}Ga_{0.9}N$ layer (film thickness: 35 μm) (106, 206) having a Mg density of $3\times10^{19}$ cm$^{-3}$ were grown were on the substrate (101, 201) composed of sapphire.

Here growth was suspended and the epitaxial wafer was taken out. Then to remove the remaining Mg from the growth apparatus, the temperature was raised to 1200 degrees Celsius while hydrogen was fed at a rate of 50 slm when there is no epitaxial wafer in the growth apparatus. Baking was carried out for about 30 minutes. After that, the temperature of the growth apparatus was again reduced to the room temperature, and the epitaxial wafer taken out previously was placed into the growth apparatus.

The temperature of the growth apparatus was set at 750 degrees Celsius, and a quantum well structure (InGaN/GaN multiple quantum well layer (active layer) (105, 205) was formed, wherein this quantum well structure was composed of a 6-cycle Si doped n-type GaN layer having a density of undoped $In_{0.15}Ga_{0.85}N$ quantum well layer (film thickness: 3.5 nm)/Si of $3\times10^{18}$ cm$^{-3}$. Finally, several types of similar epitaxial wafers were manufactured, wherein Si doped n-type GaN layer (104, 204) having a Si density of $3\times10^{18}$ cm$^{-3}$ had a thickness of 200 nm through 3000 nm.

The same experiment as that in the first embodiment was conducted on these epitaxial wafers. Similarly to the case of the first embodiment, a considerable increase was observed in the light emitting output over the prior art LED structure under the following conditions:

1) The percentage of the area occupied by the opening on the surface of the LED structure was 10% or more without exceeding through 85%.

2) The diameter of the circumscribed circle of the bore is 100 nm or more without exceeding 4000 nm, and the bore depth was 100 nm or more without exceeding 1000 nm and smaller than the overall thickness of the n-type semiconducting layer (distance between active layer and flat portion).

3) The bore density was $8\times10^5$ per/cm$^2$ or more without exceeding $1.08\times10^{10}$ per/cm$^2$.

Embodiment 6

The same experiments as those in the first embodiment were conducted, except that the substrate was changed into the one containing SiC, GaN, AlN or ZnO. When any one of these substrates was used, the LED structure of the present invention exhibited an increase of light emitting output amounting to 1.5 through 2 times that of the prior art LED structure. This has demonstrated that the present invention is applicable independently of the type of the substrate to be used.

Embodiment 7

Figure 11:
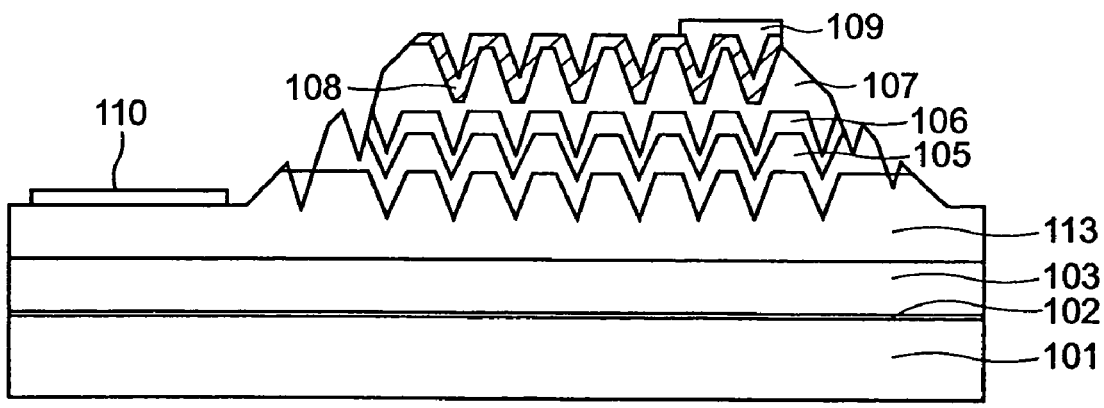
FIG. 11 is a cross sectional view of a light emitting diode provided with a current distribution layer formed of a transparent conductive film made of metal or metal oxide in a further embodiment (Embodiment 7) of the present invention.
Figure 12:
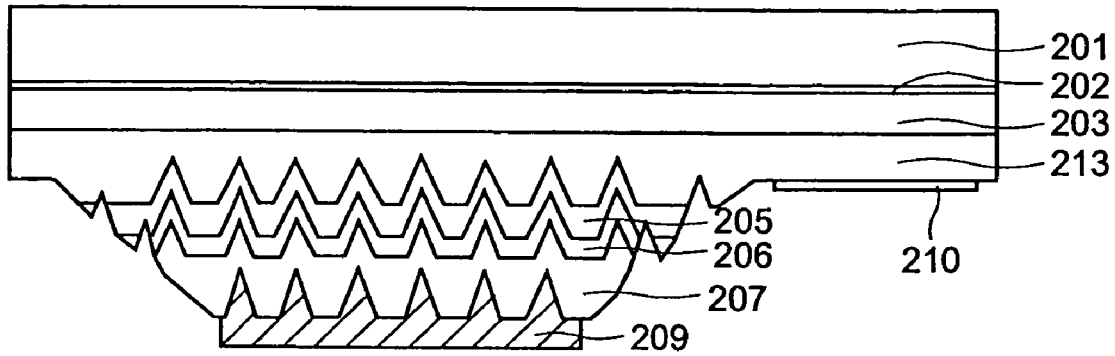
FIG. 12 is a cross sectional view of a light emitting diode of flip chip type structure in a further embodiment (Embodiment 7) of the present invention.

As shown in FIGS. 11 and 12, based on the growth procedure of the prior art LED structure described in the first embodiment, attempts were made to dope Si into the n-type GaN layer to a high density, thereby forming an n-type high-impurity-density doped layer (113, 213), and then forming bores on the LED structure surface.

As a result of this experiment, when the substrate temperature was higher than 1,000 degrees Celsius that was the substrate temperature normally used for the growth of the GaN layer, a Si doped n-type GaN layer having a Si density of $5\times10^{18}$ cm$^{-3}$ or more was grown to a thickness of 1 μm or more. Then bores were formed on the surface, subsequent to the growth of the n-type GaN layer.

It became clear that these bores remained even after the formation of the active layer and p-type semiconducting layer, and bores having a depth and diameter of 100 nm or more were formed on the LED structure surface. The preferred substrate temperature in this case was 1,000 through 1,200 degrees Celsius, the preferred growth temperature was 0.1 nm/s-10 nm/s, and the preferred ratio of Group V material to Group III material was 100 to 50,000. The preferred ratio of hydrogen to nitrogen in the carrier gas was 1:0 through 1:10.

Further, the preferred growth pressure was 10 kPa through 150 kPa. The preferred overall amount of the gas introduced into the growth apparatus was such that gas flow rate at the position of substrate installation would be 0.1 through 10 m/s at the temperature expressed in terms of room temperature.

The relationship between surface configuration and light emitting output of the LED was similar to the case of the first embodiment. Namely, a considerable increase was observed in the light emitting output over the prior art LED structure under the following conditions:

1) The percentage of the area occupied by the opening on the surface of the LED structure was 10% or more without exceeding through 85%.

2) The diameter of the circumscribed circle of the bore is 100 nm or more without exceeding 4000 nm, and the bore depth was 100 nm or more without exceeding 1000 nm and smaller than the overall thickness of the p-type semiconducting layer (distance between active layer and flat portion).

3) The bore density was $8 \times 10^5$ per/$cm^2$ or more without exceeding $1.08 \times 10^{10}$ per/$cm^2$.

Embodiment 8

Figure 13:
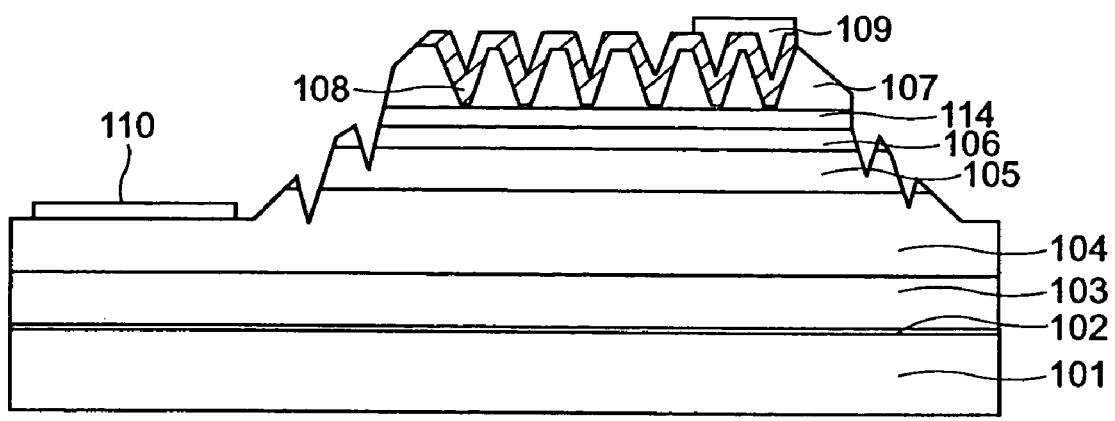
FIG. 13 is a cross sectional view of a light emitting diode provided with a current distribution layer formed of a transparent conductive film made of metal or metal oxide in a further embodiment (Embodiment 8) of the present invention.
Figure 14:
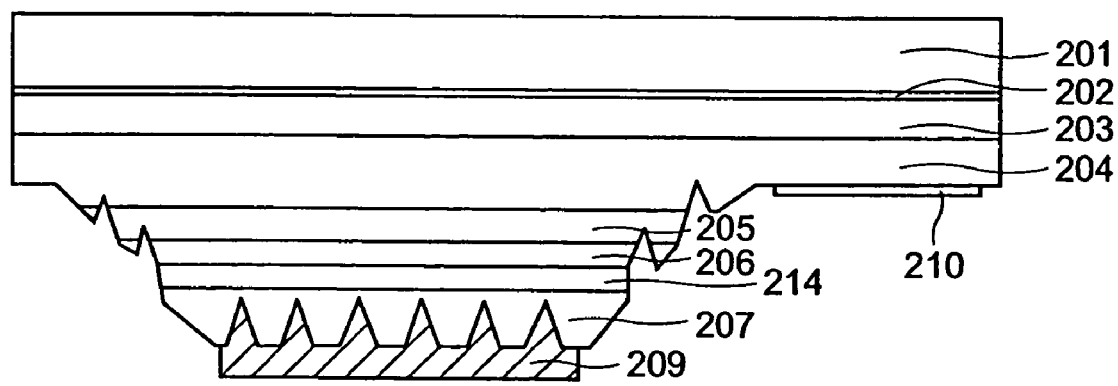
FIG. 14 is a cross sectional view of a light emitting diode of flip chip type structure in a further embodiment (Embodiment 8) of the present invention.

As shown in FIGS. 13 and 14, based on the growth procedure of the prior art LED structure described in the first embodiment, attempts were made to grow the p-type GaN layer at the substrate temperature lower than 1,000 degrees Celsius that was the substrate temperature normally used for the growth of the GaN layer, thereby forming bores on the surface of the LED structure.

However, when the substrate temperature was 700 through 1,000 degrees Celsius, the amount of Mg to be doped was set to about $1 \times 10^{19}$/$cm^3$ normally capable of obtaining the p-type GaN layer of normally low resistance. In this case, in order to form bores having the depth and diameter that could improve light extraction efficiency, the p-type GaN layer had to be grown to a thickness of 1,000 nm or more. The light emitting output of the LED having bores on the surface created in this manner was reduced below that of the prior art LED structure since light was absorbed by the thick p-type GaN layer.

The inventor of the present invention has found out that the film thickness of the p-type GaN layer required for the bore to be formed on the surface of the LED structure can be kept at 1,000 nm or less, by increasing the amount of Mg to be doped into the p-type GaN layer (107, 207).

To put it more specifically, when the thickness of the p-type GaN layer (107, 207) is 100 nm or more without exceeding 1 μm (wherein light absorption does not raise any problem, and bores having a depth of 100 nm or more can be formed in principle), in order to form the bore having a depth, diameter and density sufficient to increase the light extraction efficiency, it is necessary to create the p-type bore formed layer (114, 214) that is formed under the condition of p-type impurity density (unit: /$cm^3$)$>4.58 \times 10^{18} e^{0.00211 Tg}$, where the substrate temperature is assumed as Tg (unit:degrees Celsius).

The preferred substrate temperature Tg in this case was 700 through 1,000 degrees Celsius, and the preferred growth rate was 0.1 nm/s through 10 nm/s. The preferred ratio of Group V material to Group III material was 100 to 50,000, and the preferred ratio of hydrogen to nitrogen in the carrier gas was 1:0 through 1:10.

Further, the preferred growth pressure was 10 kPa through 150 kPa. The preferred overall amount of the gas introduced into the growth apparatus was such that gas flow rate at the position of substrate installation would be 0.1 through 10 m/s at the temperature expressed in terms of room temperature.

The same experiment as that in the first embodiment was conducted on the LED manufactured in this manner. Similarly to the case of the first embodiment, a considerable increase was observed in the light emitting output over the prior art LED structure under the following conditions:

1) The percentage of the area occupied by the opening on the surface of the LED structure was 10% or more without exceeding through 85%.

2) The diameter of the circumscribed circle of the bore is 100 nm or more without exceeding 4000 nm, and the bore depth was 100 nm or more without exceeding 1000 nm and smaller than the overall thickness of the p-type semiconducting layer (distance between active layer and flat portion).

3) The bore density was $8 \times 10^5$ per/$cm^2$ or more without exceeding $1.08 \times 10^{10}$ per/$cm^2$.

Embodiment 9

For the epitaxial wafer similar to that of the first embodiment, bores were formed on the surface according to the following method:

1) Heat treatment in the atmosphere mainly containing any one of independent ammonia, a mixture of ammonia and hydrogen, a mixture of ammonia and nitrogen, and a mixture of ammonia, hydrogen and nitrogen at a temperature of 800 through 1,300 degrees Celsius, when covered with an independent film or composite film of Ni, W, Al, Ti, Au, Pt, Pd and In, having a thickness of 0.5 nm or more without exceeding 100 nm (wherein the metallic film on these epitaxial wafers was removed by acid or alkaline solution before LED device processing is applied).

2) Wet etching in an aqueous solution of $H_2SO_4$, $H_3PO_4$, HCl, KOH, and NaOH, an ethylene glycol solution, an aqueous solution of their mixture or an ethylene glycol solution.

3) Electrochemical etching in an aqueous solution of $H_2SO_4$, $H_3PO_4$, HCl, KOH, and NaOH, an ethylene glycol solution, an aqueous solution of their mixture or an ethylene glycol solution.

4) Dry etching by a gas containing at least one of HCl, $Cl_2$, $SF_6$, $BCl_3$ and $CH_4$.

Bores can be formed on the surface of the LED by any of these methods. However, the density, diameter and depth thereof depend on the conditions for formation. In any case, similarly to the case of the first embodiment, a considerable increase was observed in the light emitting output over the prior art LED structure under the following conditions:

1) The percentage of the area occupied by the opening on the surface of the LED structure was 10% or more without exceeding through 85%.

2) The diameter of the circumscribed circle of the bore is 100 nm or more without exceeding 4000 nm, and the bore depth was 100 nm or more without exceeding 1000 nm and smaller than the overall thickness of the p-type semiconducting layer (distance between active layer and flat portion).

3) The bore density was $8 \times 10^5$ per/cm$^2$ or more without exceeding $1.08 \times 10^{10}$ per/cm$^2$.

Embodiment 10

The surface of the epitaxial wafer was etched in H$_3$PO4 at a temperature of 150 through 200 degrees Celsius for 5 through 30 minutes, using the LED structures of the present invention, described in the seventh and eighth embodiments, wherein the percentage of the improvement in light emitting output is about 1.5 times that of the prior art LED structure.

The bore diameter and depth subsequent to this etching were greater than those obtained in the phase of the sixth and seventh embodiments, with the result that the light emitting output of these LEDs was increased to 1.8 through 2.2 times that of the prior art LED structure. The same result was obtained when etching was carried out at a temperature of 150 through 250 degrees Celsius in the solution of H$_2$SO$_4$, HCl, KOH or NaOH other than H$_3$PO$_4$, or the solution of the mixture thereof.

Embodiment 11

Powder composed of the material having a greater refraction index (n>1.5) than the LED-sealing epoxy resin was attached to the bored surface of the bore-equipped LED structure of the present invention described in the first embodiment, and on the side formed by etching.

This procedure improved the light emitting output, and provided the light emitting output amounting to a maximum of about 2.5 times that of the prior art LED structure. To put it more specifically, preferred powder includes GaN, AlN, TiO$_2$, ZnS, sapphire, SiC, diamond, ZnO and ZnS. The preferred powder diameter was 100 nm or more without exceeding 10 μm.

Embodiment 12

The aforementioned embodiments have demonstrated an example of using Mg as the n-type impurity, without the advantages of the present invention being restricted thereto.

For example, in many cases of the present invention, the same advantages have been obtained when Se, O, Ge or Te is used as the n-type impurity. The same advantages have been obtained when Be, Zn or C is used as the p-type impurity.

Embodiment 13

The aforementioned embodiment shows an example of the surface light extraction type LED structure wherein the transparent conductive film was arranged also inside the bore. Almost the same advantages have been obtained when the transparent conductive film was formed only on the flat portion. Such a form of electrode can be obtained by vapor deposition wherein the electrode material is tilted with reference to the normal line of the epitaxial wafer surface.

Embodiment 14

Further, the aforementioned embodiment shows an example where a transparent conductive film composed of Ni/Au was used as the transparent conductive film. Without the present invention being restricted thereto, almost the same advantages have been obtained when the transparent conductive film composed of Pd/Au, or the transparent conductive film containing the material composed of a metallic oxide such as ITO and ZnO was used.

Embodiment 15

Further, the aforementioned embodiment shows the case where Ag was used as the first electrode pad (109, 209) for the flip chip type LED structure. Without the present invention being restricted thereto, almost the same advantages have been obtained by using the electrode formed by vapor deposition of the film made of Ni, Pd, Ti, Ag, Cu, Al or Au, or the composite thereof to a thickness that does not allow passage of light.

What is claimed is:

1. A light emitting diode of the semiconductor lamination structure comprising at least:
    an n-type semiconducting layer,
    an active layer composed of 30 or less quantum well layers,
    a p-type semiconducting layer provided on a substrate, wherein the surface of said semiconductor lamination structure contains a flat portion and bores;
    the in-plane coverage rate of said bores is 10% or more without exceeding 85%;
    the opening of said bore has a diameter of 100 nm or more without exceeding 4000 nm;
    the depth of said bore is smaller than the distance between said active layer and said flat portion; and
    the density of said bores expressed in terms of number of bores is $8 \times 10^5$ per/cm$^2$ or more without exceeding $1.08 \times 10^{10}$ per/cm$^2$, and
    a transparent conductive film covering a plurality of said bores.

2. The light emitting diode according to claim 1, wherein said bore is conical.

3. The light emitting diode according to claim 1, wherein said n-type semiconducting layer and p-type semiconducting layer are composed of nitride semiconductor.

4. The light emitting diode according to claim 3, wherein said quantum well layer is composed of a well layer containing In$_x$Al$_y$Ga$_z$N (where $0 \leq x, y, z \leq 1$, $x + y + z = 1$), and a barrier layer containing In$_a$Al$_b$Ga$_c$N (where $0 \leq a, b, c \leq 1$, $a + b + c = 1$), having a different composition from that of said well layer, and a greater band gap energy than said well layer.

5. The light emitting diode according to claim 4, wherein said well layer is not doped, and said barrier layer is of n-type.

6. The light emitting diode according to claim 3, wherein the n-type semiconducting layer and/or p-type semiconducting layer is composed of a plurality of layers having different doping densities or compositions.

7. The light emitting diode according to claim 6, wherein the n-type semiconducting layer contains an undoped GaN layer and an n-type GaN layer.

8. The light emitting diode according to claim 6, wherein said p-type semiconducting layer includes a p-type AlGaN layer and a p-type GaN layer.

9. The light emitting diode according to claim 3, wherein said n-type semiconducting layer is formed between said p-type semiconducting layer and substrate.

10. The light emitting diode according to claim 3, wherein said p-type semiconducting layer is formed between said n-type semiconducting layer and substrate.

11. The light emitting diode according to claim 1, wherein said active layer is composed of a plurality of quantum well layers.

12. The light emitting diode according to claim 1, wherein said flat portion is provided on a surface of said n-type semiconducting layer, and said bores are provided on a surface of said p-type semiconducting layer.

13. The light emitting diode according to claim 12, wherein a first electrode pad is provided on said transparent conductive film, and a second electrode pad is provided on said flat portion of said n-type semiconducting layer.

14. The light emitting diode according to claim 1, wherein all of said bores are formed in an outermost surface semiconductor layer of said semiconductor lamination structure.

15. A light emitting diode having a semiconductor lamination structure, comprising:
   a substrate;
   an n-type semiconducting layer provided on the substrate, wherein a surface of the n-type semiconducting layer opposite a surface adjacent the substrate contains a flat portion and bores;
   an active layer composed of 30 or less quantum well layers provided on at least a portion of the n-type semiconducting layer containing the bores, wherein a surface of the active layer opposite a surface adjacent the n-type semiconducting layer contains bores corresponding to the bores in the surface of the n-type semiconducting layer;
   a p-type semiconducting layer provided on the active layer, wherein a surface of the p-type semiconducting layer opposite a surface adjacent the active layer contains bores corresponding to the bores in the surface of the active layer and the n-type semiconducting layer, and wherein the bores in the surface of the p-type semiconducting layer have an in-plane coverage rate of 10% or more without exceeding 85%, the opening of each bore has a diameter of 100 nm or more without exceeding 4000 nm, the depth of each bore is 100 nm or more and smaller than the distance between the active layer and the flat portion, and the density of the bores expressed in terms of number of bores is $8\times10^5$ per/cm$^2$ or more without exceeding $1.08\times10^{10}$ per/cm$^2$; and
   a transparent conductive film covering a plurality of the bores.

16. The light emitting diode according to claim 15, further comprising a buffer layer provided between the substrate and the n-type semiconducting layer.

17. The light emitting diode according to claim 15, wherein the depth of each bore is 100 nm or more without exceeding 1000 nm.

18. The light emitting diode according to claim 15, wherein each bore is conical.

19. The light emitting diode according to claim 15, wherein each bore is multi-pyramidal.

20. The light emitting diode according to claim 15, wherein the n-type semiconducting layer and the p-type semiconducting layer are composed of nitride semiconductor.

21. The light emitting diode according to claim 20, wherein each of the quantum well layers is composed of a well layer containing $In_xAl_yGa_zN$ (where $0 \leq x, y, z \leq 1$, $x+y+z=1$), and a barrier layer containing $In_aAl_bGa_cN$ (where $0 \leq a, b, c \leq 1$, $a+b+c=1$), having a different composition from that of the well layer, and a greater band gap energy than the well layer.

22. The light emitting diode according to claim 21, wherein the well layer is not doped, and the barrier layer is of n-type.

23. The light emitting diode according to claim 20, wherein the n-type semiconducting layer and/or the p-type semiconducting layer is composed of a plurality of layers having different doping densities or compositions.

24. The light emitting diode according to claim 23, wherein the n-type semiconducting layer contains an undoped GaN layer and an n-type GaN layer.

25. The light emitting diode according to claim 23, wherein said p-type semiconducting layer includes a p-type AlGaN layer and a p-type GaN layer.

26. The light emitting diode according to claim 15, wherein the active layer is composed of a plurality of quantum well layers.

27. The light emitting diode according to claim 15, further comprising a first electrode pad provided on the transparent conductive film, and a second electrode pad provided on the flat portion of the n-type semiconducting layer.

* * * * *